US008742425B2

(12) United States Patent
Kim et al.

(10) Patent No.: US 8,742,425 B2
(45) Date of Patent: Jun. 3, 2014

(54) THIN FILM TRANSISTOR ARRAY SUBSTRATE, ORGANIC LIGHT-EMITTING DISPLAY DEVICE COMPRISING THE SAME, AND METHOD OF MANUFACTURING THE SAME

(71) Applicants: Sung-Ho Kim, Yongin (KR); Jong-Moo Huh, Yongin (KR)

(72) Inventors: Sung-Ho Kim, Yongin (KR); Jong-Moo Huh, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/666,196

(22) Filed: Nov. 1, 2012

(65) Prior Publication Data

US 2013/0313529 A1   Nov. 28, 2013

(30) Foreign Application Priority Data

May 23, 2012   (KR) .................. 10-2012-0054947

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| H01L 29/10 | (2006.01) | |
| H01L 31/00 | (2006.01) | |

(52) U.S. Cl.
USPC .................. 257/72; 257/59; 257/E29.273

(58) Field of Classification Search
USPC ...................... 257/59, 72, E29.273
See application file for complete search history.

(56) References Cited

U.S. PATENT DOCUMENTS

| | | | |
|---|---|---|---|
| 7,316,944 B2* | 1/2008 | Ahn ............................... 438/155 |
| 7,435,631 B2* | 10/2008 | Yang ............................. 438/149 |
| 7,470,621 B2* | 12/2008 | Endo et al. .................... 438/689 |
| 7,602,456 B2* | 10/2009 | Tanaka et al. .................. 349/43 |
| 7,667,681 B2* | 2/2010 | Murade .......................... 345/92 |
| 7,973,317 B2* | 7/2011 | Chen et al. ..................... 257/72 |
| 8,319,221 B2* | 11/2012 | Choi et al. ...................... 257/59 |
| 8,368,071 B2* | 2/2013 | Ishikawa ........................ 257/59 |
| 8,415,182 B2* | 4/2013 | Cho et al. ....................... 438/24 |
| 8,604,480 B2* | 12/2013 | Kim et al. ...................... 257/59 |
| 2005/0095874 A1* | 5/2005 | Park et al. ..................... 438/800 |
| 2006/0261341 A1* | 11/2006 | Akimoto et al. ............... 257/66 |
| 2010/0025677 A1 | 2/2010 | Yamazaki et al. |
| 2011/0169002 A1* | 7/2011 | Jan et al. ........................ 257/59 |
| 2011/0278615 A1* | 11/2011 | No et al. ........................ 257/98 |
| 2011/0297944 A1 | 12/2011 | Choi et al. |
| 2012/0032177 A1* | 2/2012 | Hosoya ......................... 257/59 |
| 2012/0286281 A1* | 11/2012 | You ............................... 257/72 |
| 2013/0037783 A1* | 2/2013 | Lee et al. ....................... 257/40 |
| 2013/0056710 A1* | 3/2013 | Oh et al. ........................ 257/40 |

FOREIGN PATENT DOCUMENTS

| | | |
|---|---|---|
| JP | 2010-56541 | 3/2010 |
| JP | 2012094511 A * | 5/2012 |
| KR | 10-2011-0133925 | 12/2011 |

* cited by examiner

*Primary Examiner* — Ida M Soward
(74) *Attorney, Agent, or Firm* — Lee & Morse, P.C.

(57) ABSTRACT

A thin film transistor array substrate includes a thin film transistor including a gate electrode, an active layer, and source and drain electrodes, a pixel electrode on a same layer as the gate electrode, a lower electrode of a capacitor, the lower electrode being on the same layer as the gate electrode, a first insulating layer on the gate electrode and the lower electrode, a second insulating layer between the active layer and the source and drain electrodes, an upper electrode on the first insulating layer, the upper electrode including a first layer made of a same material as the active layer, and a second layer made of a same material as the source and drain electrodes, and a third insulating layer that covers the source and drain electrodes and the upper electrode and exposes the pixel electrode.

22 Claims, 9 Drawing Sheets

THIN FILM TRANSISTOR ARRAY SUBSTRATE, ORGANIC LIGHT-EMITTING DISPLAY DEVICE COMPRISING THE SAME, AND METHOD OF MANUFACTURING THE SAME

CROSS-REFERENCE TO RELATED PATENT APPLICATION

This application claims the benefit under 35 U.S.C. §119 of Korean Patent Application No. 10-2012-0054947, filed on May 23, 2012, in the Korean Intellectual Property Office, the disclosure of which is incorporated herein in its entirety by reference.

BACKGROUND

1. Field

Embodiments relate to a thin film transistor array substrate, an organic light-emitting display device comprising the thin-film transistor array substrate, and a method of manufacturing the thin-film transistor array substrate.

2. Description of the Related Art

A flat panel display device, such as an organic light-emitting display device and a liquid crystal display device, includes a thin film transistor (TFT), a capacitor, and wiring connecting them.

A substrate used to prepare a flat panel display device has a fine pattern including a TFT, a capacitor, and wiring. A photo-lithography process for transferring a pattern by using a mask is widely used to form the fine pattern of the substrate.

In a photo-lithography process, a photoresist is uniformly coated on a substrate on which a pattern will be formed and exposed to light by using a photomask and an exposure device such as a stepper. When a positive photoresist is used, the photo-sensed photoresist is developed. After the photoresist is developed, the pattern on the substrate is etched using the remaining photoresist, and excess photoresist is removed after the pattern is formed.

SUMMARY

Embodiments are directed to a thin film transistor array substrate, including a thin film transistor including a gate electrode, an active layer, and source and drain electrodes, a pixel electrode on a same layer as the gate electrode, a lower electrode of a capacitor, the lower electrode being on the same layer as the gate electrode, a first insulating layer on the gate electrode and the lower electrode, a second insulating layer between the active layer and the source and drain electrodes, an upper electrode on the first insulating layer, the upper electrode including a first layer made of a same material as the active layer, and a second layer made of a same material as the source and drain electrodes, and a third insulating layer that covers the source and drain electrodes and the upper electrode and exposes the pixel electrode.

The gate electrode and the lower electrode may each include a first layer including a transparent conductive material and a second layer including a metal.

The active layer and the first layer of the upper electrode may include crystalline silicon.

The source and drain electrodes and the second layer of the upper electrode may include a first portion including ion impurity-containing amorphous silicon and a second portion including metal, the second portion being on the first portion.

The first portion of the source and drain electrodes may partially contact first and second portions of the active layer via first and second contact holes formed in the second insulating layer.

The first portion of the second layer of the upper electrode may directly contact the first layer of the upper electrode via a third contact hole formed in the second insulating layer.

The first insulating layer and the second insulating layer may be offset from edges of the pixel electrode. The third insulating layer may cover edges of the pixel electrode. A border of the active layer may be greater than the gate electrode such that the active layer covers a border of the gate electrode. A border of the active layer may be offset from a border of the gate electrode.

Embodiments are also directed to an organic light-emitting display device including a thin film transistor that includes a gate electrode, an active layer, and source and drain electrodes, a pixel electrode on a same layer as the gate electrode, a lower electrode of a capacitor, the lower electrode being on the same layer as the gate electrode, a first insulating layer on the gate electrode and the lower electrode, a second insulating layer between the active layer and the source and drain electrodes, an upper electrode on the first insulating layer, the upper electrode including a first layer made of a same material as the active layer, and a second layer made of a same material as the source and drain electrodes, a third insulating layer that covers the source and drain electrodes and the upper electrode and exposes the pixel electrode, an intermediate layer on the pixel electrode, the intermediate layer including an organic emission layer, and a counter electrode on the intermediate layer.

The counter electrode may be a reflective electrode that reflects light emitted from the organic emission layer.

The pixel electrode may include a transparent conductive material. The gate electrode and the lower electrode may include a first layer including a transparent conductive material and a second layer including metal.

The active layer and the first layer of the upper electrode may include crystalline silicon.

The upper electrode of the capacitor may include a first layer made of a same material as the active layer, and a second layer made of a same material as the source and drain electrodes. The source and drain electrodes and the second layer of the upper electrode may include a first portion including ion impurity-containing amorphous silicon and a second portion including metal, the second portion being on the first portion.

Embodiments are also directed to a method of manufacturing a thin-film transistor array substrate, including a first mask process, wherein a transparent conductive layer and a first metal layer are sequentially formed on a substrate, and a pixel electrode, a gate electrode of a thin film transistor, and a lower electrode of a capacitor are formed by patterning the transparent conductive layer and the first metal layer, a second mask process, wherein an active layer of the thin film transistor and a first layer of an upper electrode of the capacitor are formed by sequentially stacking a first insulating layer and a first semiconductor layer and patterning the first semiconductor layer, a third process, wherein a second insulating layer and contact holes that expose the pixel electrode, a portion of the active layer, and the first layer of the upper electrode are formed, a fourth mask process, wherein source and drain electrodes that partially contact the active layer, and the second layer of the upper electrode are formed by sequentially stacking a second semiconductor layer and a second metal layer and patterning the second semiconductor layer and the second metal layer, and a fifth mask process, wherein a third insulating layer is formed, and a portion of the third insulating layer formed on the pixel electrode is removed.

The first semiconductor layer that is stacked and patterned in the second mask process may include crystalline silicon.

A border of the active layer formed in the second mask process may be greater than the gate electrode such that the active layer covers a border of the gate electrode.

The border of the active layer formed in the second mask process may be offset from a border of the gate electrode.

In the third mask process, a gap may be formed between etched surfaces of the first and second insulating layers and the pixel electrode.

In the fourth mask process, the first metal layer, the second semiconductor layer, and the second metal layer may be simultaneously etched in the pixel electrode.

The second semiconductor layer formed in the fourth mask process may include amorphous silicon including ion impurities.

BRIEF DESCRIPTION OF THE DRAWINGS

Features will become more apparent by describing in detail exemplary embodiments thereof with reference to the attached drawings in which.

DETAILED DESCRIPTION

Hereinafter, embodiments will be described more fully with reference to the accompanying drawings, in which exemplary embodiments thereof are shown. As used herein, the term "and/or" includes any and all combinations of one or more of the associated listed items. Expressions such as "at least one of," when preceding a list of elements, modify the entire list of elements and do not modify the individual elements of the list.

Figure 1:
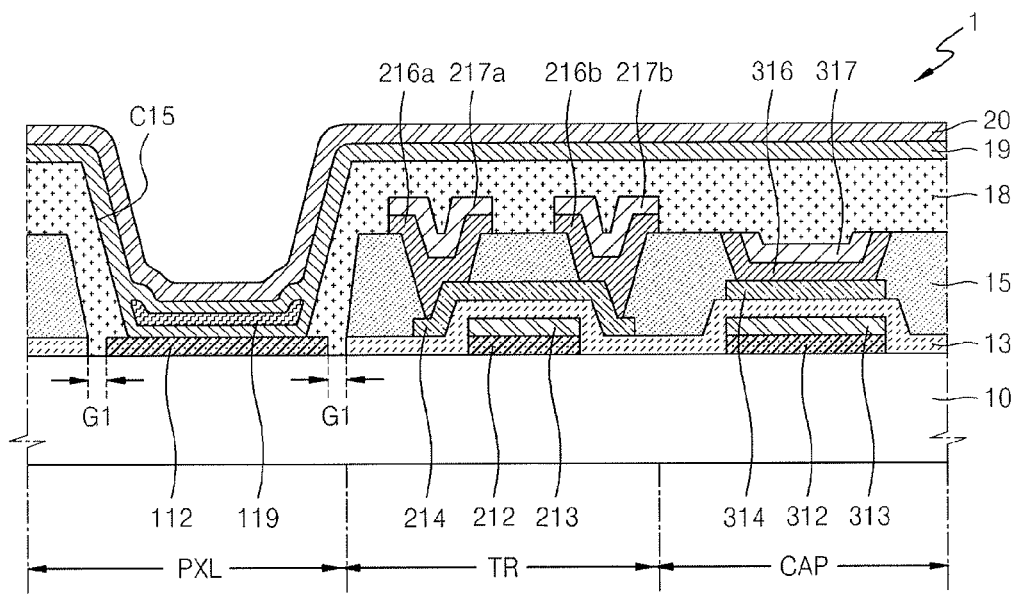
FIG. 1 is a schematic cross-sectional view of an organic light-emitting display device according to an embodiment.

FIG. 1 is a schematic cross-sectional view of an organic light-emitting display device 1 according to an embodiment.

Referring to FIG. 1, the organic light-emitting display device 1 includes a pixel region PXL that includes an intermediate layer 19 having an organic emission layer 119, a transistor region TR that includes a thin film transistor (TFT), and a capacitor region CAP that includes a capacitor, which are all formed on a substrate 10.

In the pixel region PXL, a pixel electrode 112 including a transparent conductive material is formed on the substrate 10.

The substrate 10 may be a transparent glass substrate including $SiO_2$ as a main component. The substrate 10 may also be a plastic substrate including polyethylene terephthalate (PET), polyethylene naphthalate (PEN), polyimide, or the like, as well as the glass substrate.

Although not shown in FIG. 1, a buffer layer including $SiO_2$ and/or $SiN_x$ may be formed between the substrate 10 and the pixel electrode 112 in order to improve smoothness and inhibit the penetration of impurities.

The pixel electrode 112 may includes at least one compound selected from the group of indium tin oxide (ITO), indium zinc oxide (IZO), zinc oxide (ZnO), indium oxide ($In_2O_3$), indium gallium oxide (IGO), and aluminum zinc oxide (AZO). In addition, the pixel electrode 112 may include a plurality of metal layers further including a semi-transparent metal layer including silver (Ag). If a counter electrode 20 is formed of a reflective metal, the semi-transparent metal layer may form a resonance structure with the counter electrode 20, so that light extraction efficiency of a display device may be improved.

A first insulating layer 13 and a second insulating layer 15 are sequentially formed on sides of the pixel electrode 112. A gap G1 is formed between the pixel electrode 112 and etched surfaces of the first insulating layer 13 and the second insulating layer 15. A third insulating layer 18 is formed on the second insulating layer 15. An opening C15 that exposes the pixel electrode 112 is formed in the third insulating layer 18.

The intermediate layer 19 including the organic emission layer 119 is formed on the pixel electrode 112. Light emitted from the organic emission layer 119 proceeds toward the substrate 10 via the pixel electrode 112 formed of a transparent conductive material.

The organic emission layer 119 may be formed of a low molecular weight organic material or polymeric organic material. If the organic emission layer 119 is formed of a low molecular weight organic material, the intermediate layer 19 may further include a hole transport layer (HTL), a hole injection layer (HIL), an electron transport layer (ETL), an electron injection layer (EIL), and the like. Various layers may further be stacked thereon, if desired. In this regard, the organic material may include copper phthalocyanine (CuPc), N,N'-di(naphthalene-1-yl)-N,N'-diphenyl-benzidine (NPB), or tris-8-hydroxyquinoline aluminum (Alq3). If the organic emission layer 119 is a polymeric organic material, the intermediate layer 19 may include an HTL. The HTL may include poly-(3,4)-ethylene-dihydroxy thiophene (PEDOT) or polyaniline (PANI). In this regard, the organic materials may include poly-phenylenevinylene (PPV)-based or polyfluorene-based polymeric organic materials.

The counter electrode 20 is deposited on the intermediate layer 19 as a common electrode. In the organic light-emitting display device 1 according to the current embodiment, the pixel electrode 112 is used as an anode, and the counter electrode 20 is used as a cathode. In other implementations, the polarity of the electrodes may be reversed.

The counter electrode 20 may be a reflective electrode including a reflective material. In this regard, the counter electrode 20 may include at least one material selected from Al, Mg, Li, Ca, LiF/Ca, and LiF/Al. If the counter electrode 20 is a reflective electrode, light emitted from the organic emission layer 119 is reflected by the counter electrode 20, passes through the pixel electrode 112 formed of a transparent conductive material, and is discharged toward the substrate 10.

The transistor region TR may include at least one TFT.

Gate electrodes 212 and 213 of the TFT are formed on the substrate 10. The gate electrodes 212 and 213 are formed on the same layer as the pixel electrode 112. The first layer 212 of the gate electrode includes a transparent conductive material that is the same as that used to form the pixel electrode 112. If the pixel electrode 112 further includes a semi-transparent metal layer including silver (Ag), the first layer 212 of the gate electrode may also have a multi-layered structure. The second layer 213 of the gate electrode may include a metallic material having low resistance. Although not shown in FIG. 1, the gate electrodes 212 and 213 are connected to a gate signal wiring.

A portion of the first insulating layer 13 that functions as a gate insulating layer is formed on the gate electrodes 212 and 213.

An active layer 214 of the TFT is disposed on the first insulating layer 13. The active layer 214 may include a semiconductor including amorphous silicon or crystalline silicon. In addition, the active layer 214 may include a transparent conductive semiconductor that includes at least one element selected from zinc (Zn), gallium (Ga), hafnium (Hf), indium (In), titanium (Ti), and tin (Sn).

The second insulating layer 15, which functions as an interlayer insulating layer, is formed on the active layer 214.

Source electrodes 216a and 217a and drain electrodes 216b and 217b are disposed on the second insulating layer 15. The first layer 216a of the source electrode and the first layer 216b of the drain electrode may include amorphous silicon that has ion impurities, and the second layer 217a of the source electrode and the second layer 217b of the drain electrode may include a metal. The source electrodes 216a and 217a and the drain electrodes 216b and 217b are respectively connected to the active layer 214 via contact holes C12 and C13 (FIG. 2C) formed in the second insulating layer 13. In this regard, the first layer 216a of the source electrode and the first layer 216b of the drain electrode, which include amorphous silicon including ion impurities, are directly connected to the active layer 214 to reduce the contact resistance of the TFT.

Although not shown in FIG. 1, one of the source electrodes 216a and 217a and the drain electrodes 216b and 217b may be connected to the pixel electrode 112 of the pixel region PXL through a via hole that simultaneously penetrates the first insulating layer 13 and the second insulating layer 15.

The capacitor region CAP includes lower electrodes 312 and 313 and upper electrodes 314, 316, and 317 of the capacitor.

The lower electrodes 312 and 313 may be formed on the same layer using the same material as the gate electrodes 212 and 213. The first layer 312 of the lower electrode may be formed on the same layer of the same material as the first layer 212 of the gate electrode, and the second layer 313 of the lower electrode may be formed on the same layer of the same material as the second layer 213 of the gate electrode.

Another portion of the first insulating layer 13 that functions as a dielectric layer is formed on the lower electrodes 312 and 313. The upper electrodes 314, 316, and 317 are formed on the first insulating layer 13.

The first layer 314 of the upper electrode may be formed on the same layer of the same material as the active layer 214. The second layers 316 and 317 of the upper electrode may be formed of the same material as the source electrodes 216a and 217a and the drain electrodes 216b and 217b. A first portion of the second layer 316 of the upper electrode is formed of the same material as the first layer 216a of the source electrode and the first layer 216b of the drain electrode, and a second portion of the second layer 317 of the upper electrode is formed of the same material as the first layer 217a of the source electrode and the first layer 217b of the drain electrode. The first portion of the second layer 316 of the upper electrode may be formed of amorphous silicon including ion impurities, and the second portion of the second layer 317 of the upper electrode may be formed of a metal having low resistance.

Thus, the first insulating layer 13 functioning as a gate insulating layer also functions as a dielectric layer, and a metal-insulator-metal (MIM) CAP including metal-containing layers 313 and 317 are fixed in the lower electrodes and upper electrodes of the capacitor. Thus, the capacitor according to the current embodiment may have a high electrical capacity, and the size of the capacitor may be reduced. Thus, aperture ratio of the organic light-emitting display device may be increased.

The first layer 314 of the upper electrode may function as an etch stop layer that inhibits the first insulating layer 13 from being etched with the second insulating layer 15 during the etching process of the second insulating layer 15 in the capacitor region CAP. Accordingly, the first insulating layer 13 may function as a dielectric layer of the capacitor.

The edges of the first layer 314 of the upper electrode may be surrounded by the second insulating layer 15, and the second layers 316 and 317 of the upper electrode may be formed in a contact hole C14 (FIG. 2C) formed in the second insulating layer 15.

FIGS. 2A to 2E are cross-sectional views for describing mask processes used to prepare the organic light-emitting display device 1 of FIG. 1.

Figure 2A:
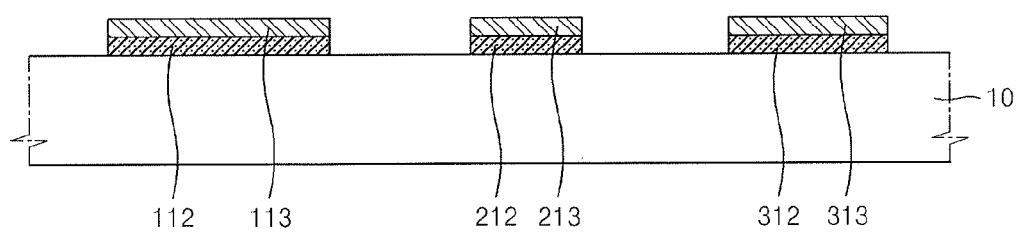
FIGS. 2A to 2E are cross-sectional views for describing mask processes used to prepare the organic light-emitting display device of FIG. 1.

FIG. 2A shows a product obtained in a first mask process. Although not shown herein in detail, a transparent conductive layer and the first metal layer are sequentially stacked on the substrate 10, and a photoresist is coated thereon. Then, the pixel electrodes 112 and 113, the gate electrode 212 and 213 of the TFT, and the lower electrodes 312 and 313 of the capacitor are simultaneously patterned by using a photolithography process using a first mask. The patterning process using photolithography includes a series of processes such as exposure, development, etching, and stripping or ashing, and the same descriptions will not be provided in subsequent mask processes.

Figure 2B:
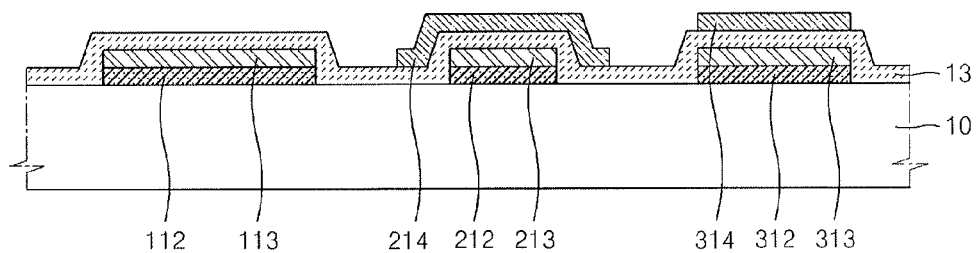

FIG. 2B shows a product obtained in a second mask process. Referring to FIG. 2B, the first insulating layer 13 is formed on the product of the first mask process, and a first semiconductor layer is formed on the first insulating layer 13. The active layer 214 of the TFT and the first layer 314 of the upper electrode of the capacitor are formed by patterning the first semiconductor layer.

The first semiconductor layer may be formed of amorphous silicon, crystalline silicon, or transparent conductive oxide semiconductor. If the first semiconductor layer is formed of amorphous silicon, a process for crystallizing the amorphous silicon may further be performed. The amorphous silicon may be crystallized by using various methods, such as rapid thermal annealing (RTA), solid phase crystallization (SPC), excimer laser annealing (ELA), metal induced crystallization (MIC), metal induced lateral crystallization (MILC), and sequential lateral solidification (SLS).

Figure 2C:
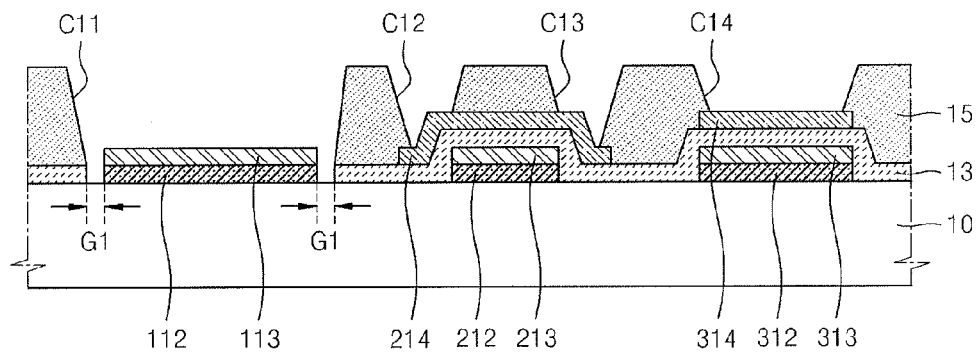

FIG. 2C shows a product obtained in a third mask process. Referring to FIG. 2C, the second insulating layer 15 is formed on the product of the second mask process, and a contact hole C11 that exposes the pixel electrodes 112 and 113, contact holes C12 and C13 that partially expose the active layer 214, and a contact hole C14 that exposes the first layer 313 of the upper electrode are formed.

While forming the contact hole C11, the first insulating layer 13 is etched along with the second insulating layer 15 during the patterning process of the second insulating layer 15 such that the second insulating layer 15 does not cover the edges of the pixel electrodes 112 and 113, in order to increase the aperture ratio. As a result, the first insulating layer 13 and the second insulating layer 15 are formed to be spaced apart from the edges of the pixel electrodes 112 and 113. The etched surfaces of the first insulating layer 13 and the second insulating layer 15 are offset from the edges of the pixel electrodes 112 and 113, and thus, the gap G1 is formed therebetween.

However, in other implementations, the second insulating layer 15 may cover the edges of the pixel electrodes 112 and 113. In this case, the first insulating layer 13 formed on the pixel electrodes 112 and 113 is etched with the second insulating layer 15 while etching the second insulating layer 15, but the gap G1 is not formed.

When the contact hole C14 is formed, the second insulating layer 15 covers the edges of the first layer 314 of the upper electrode of the capacitor, and the upper surface of the first layer 314 is exposed. The first layer 314 functions as an etch stop layer that stops the etching of the first insulating layer 13. Thus, the first insulating layer 13 functions a dielectric layer of the capacitor.

Figure 2D:
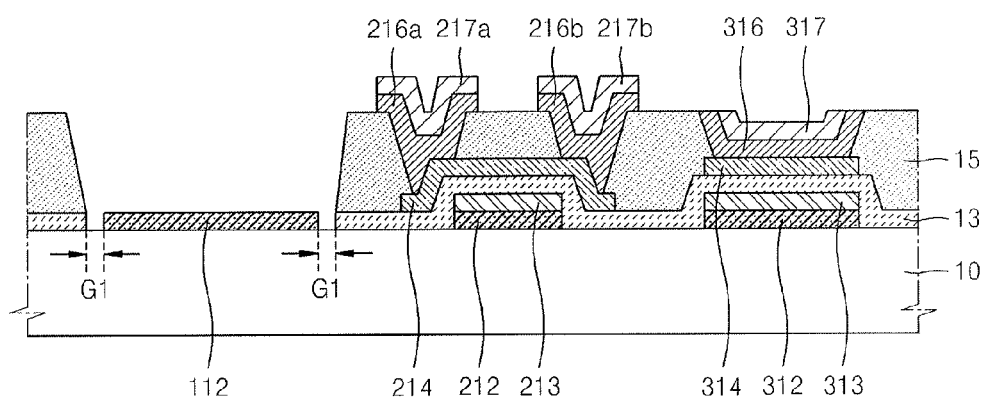

FIG. 2D shows a product obtained in a fourth mask process. Referring to FIG. 2D, the source electrodes 216a and 216b and the drain electrodes 216b and 217b which partially contact the active layer 214 and the second layers 316 and 317 of the upper electrode are formed by sequentially stacking a second semiconductor layer and a second metal layer on the product of the third mask process, and patterning the stack.

The second semiconductor layer may be formed of amorphous silicon including ion impurities, and may form the first layers 216a and 217b of the source electrode and drain electrode which directly contact a part of the active layer 214, so that a contact resistance of the TFT may be reduced.

The second semiconductor layer and the second metal layer which are stacked on the pixel electrodes 112 and 113 are not patterned, but are etched during the third mask process. The second layer 113 of the pixel electrode is also etched to expose the first layer 112 of the pixel electrode.

Figure 2E:
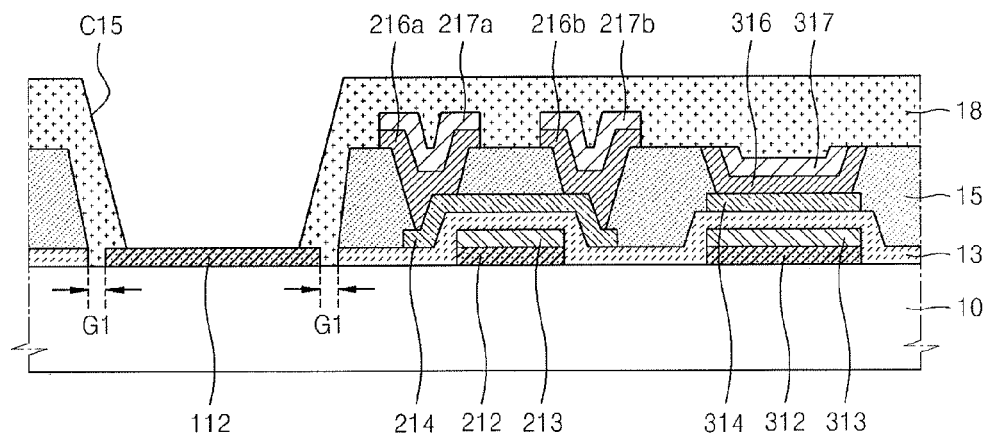

FIG. 2E shows a product of a fifth mask process. Referring to FIG. 2E, a third insulating layer 18 is formed on the product obtained in the fourth mask process, and a contact hole C15 that covers the edges of the first layer 112 of the pixel electrode and exposes the upper surface of the first layer 112 is formed. The contact hole C15 defines an emission region and also may inhibit a short between the first layer 112 of the pixel electrode and the counter electrode 20 (FIG. 1). An electric field may be inhibited from concentrating on the edges of the pixel electrode by increasing an interval between the edges of the first layer 112 of the pixel electrode and the counter electrode 20.

The intermediate layer 19 including the organic emission layer 119 and the counter electrode 20 that is a common electrode are sequentially formed on the first layer 112 of the pixel electrode (FIG. 1).

In order to prepare an organic light-emitting display device 1 including the bottom gate type TFT according to the current embodiment, only five mask processes in total may be performed. Thus, the manufacturing costs may be reduced as the number of the mask process may be decreased to five mask processes in total. The organic light-emitting display device 1 differs from the display device 2, described below, in that the possibility of current leakage occurring is reduced and/or prevented.

Figure 3:
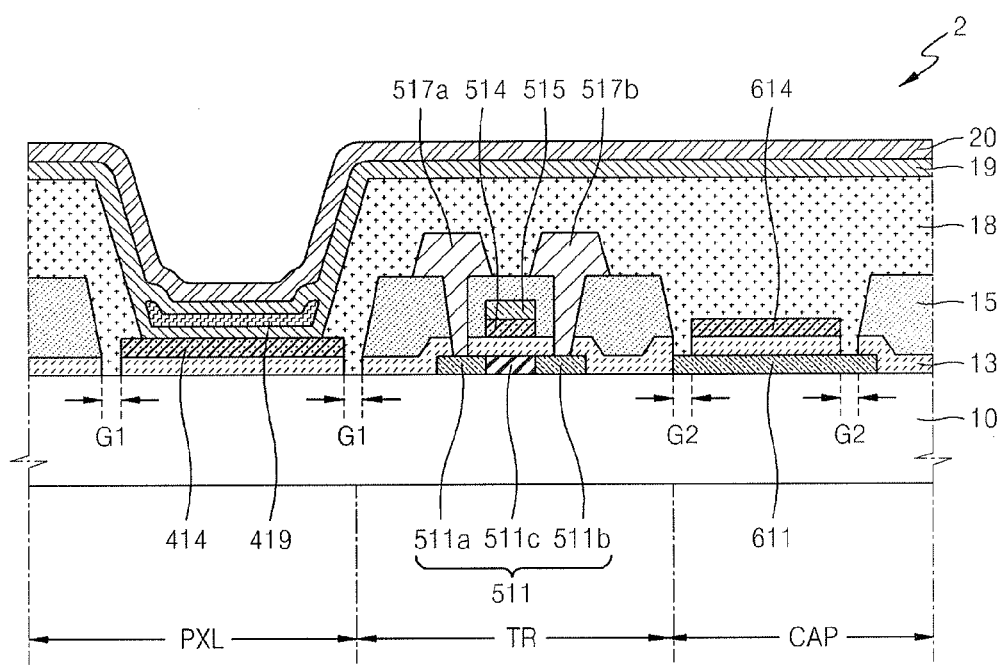
FIG. 3 is a schematic cross-sectional view of an organic light-emitting display device.

FIG. 3 is a schematic cross-sectional view of an organic light-emitting display device 2. FIGS. 4A to 4E are cross-sectional views for describing mask processes used to prepare the organic light-emitting display device 2 of FIG. 3.

Referring to FIG. 3, a pixel region PXL, a transistor region TR, and a capacitor region CAP are formed on a substrate 10.

In the pixel region PXL, a pixel electrode 414 includes a transparent conductive material formed on a first insulating layer 13 of the substrate 10, and a gap G1 is formed between etched surfaces of the first insulating layer 13 and a second insulating layer 15 and the edges of the pixel electrode 414. An opening C25 (FIG. 4E) is formed in the third insulating layer 18 to expose the pixel electrode 414.

On the pixel electrode 414, an intermediate layer 19 including an organic emission layer 419 is formed, and light emitted from the organic emission layer 119 proceeds to the substrate 10 via the pixel electrode 414 formed of a transparent conductive material. A counter electrode 20 is deposited on the intermediate layer 19 as a common electrode.

An active layer 511 of the TFT is formed on the substrate 10 in the transistor region TR. The active layer 511 includes a channel region 511c, and a source region 511a and a drain region 511b, which are doped with ion impurities and disposed at sides of the channel region 511c.

A first layer 514 and a second layer 515 of the gate electrode including a transparent conductive material are sequentially disposed on the active layer 511 to correspond to the channel region 511c of the active layer 511, with the first insulating layer 13 disposed therebetween. The first layer 514 of the gate electrode is formed on the same layer as the pixel electrode 414. The first layer 514 of the gate electrode includes a transparent conductive material that is the same material as the material used to form the pixel electrode 414.

A source electrode 517a and a drain electrode 517b, which respectively contact the source region 511a and the drain region 511b of the active layer 511, are formed on the second layer 515 of the gate electrode, wherein the second insulating layer 15 that is an interlayer insulating layer is disposed therebetween.

A third insulating layer 18 is disposed on the second insulating layer 15 to cover the source electrode 517a and the drain electrode 517b.

In the capacitor region CAP, a lower electrode 611 and an upper electrode 614 of the capacitor are formed. The lower electrode 611 includes the same material as that of the active layer 511, and the upper electrode 614 includes the same material as that of the first layer 514 of the gate electrode. In this regard, the lower electrode 611 may include an ion impurity-doped semiconductor as the same material as that of the source region 511a and the drain region 511b of the active layer 511.

The first insulating layer 13 is disposed on the lower electrode 611, but is not formed at portions of edges of the lower electrode 611. A gap G2 is formed on the edges of the lower electrode 611 next to the first insulating layer 13 and the second insulating layer 15, so that the first insulating layer 13 is be formed on a portion of the lower electrode 611.

Figure 4A:
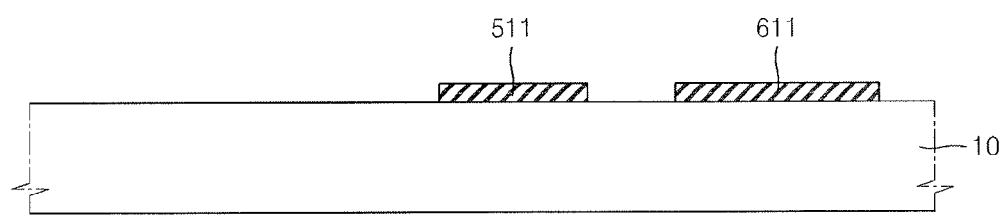
FIGS. 4A to 4E are cross-sectional views for describing mask processes used to prepare the organic light-emitting display device of FIG. 3.

FIG. 4A shows a product obtained in a first mask process. Referring to FIG. 4A, the active layer 511 and the lower electrode 611 of the capacitor are formed on the substrate 10.

Figure 4B:
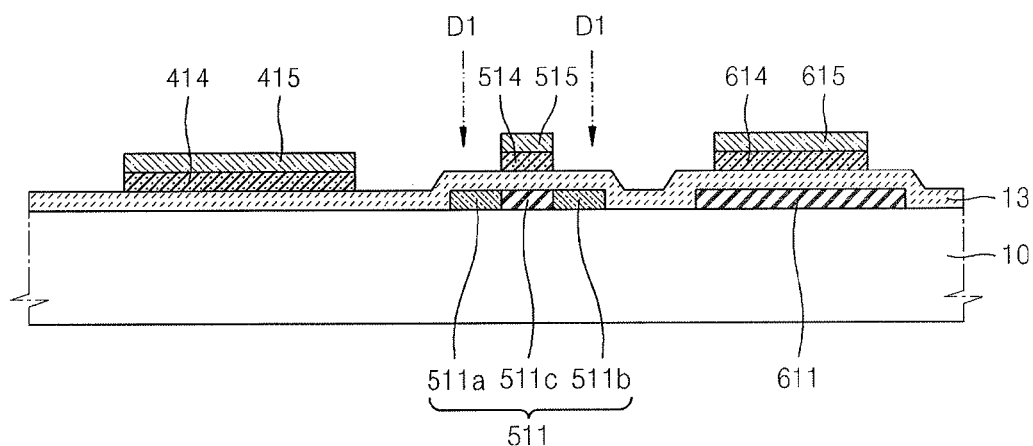

FIG. 4B shows a product obtained in a second mask process. Referring to FIG. 4B, the first insulating layer 13 is formed on the product of the first mask process, and gate electrodes 514 and 515, upper electrodes 614 and 615, and pixel electrodes 414 and 415 are formed on the first insulating layer 13. Then, a source region 511a and a drain region 511b are formed at edges of the active layer 511 by primarily doping ion impurities D1 by using the gate electrodes 514 and 515 as a self-aligned mask.

Figure 4C:
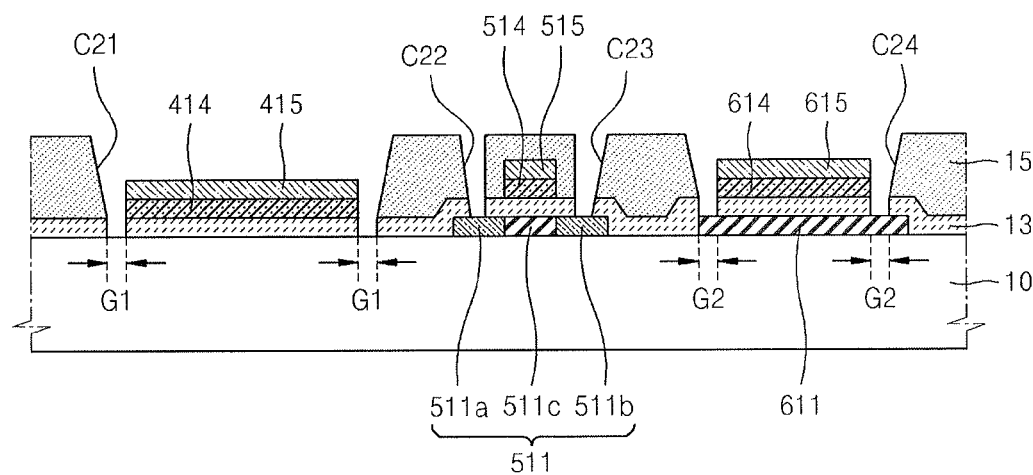

FIG. 4C shows a product obtained in a third mask process. Referring to FIG. 4C, the second insulating layer 15 is formed on the product obtained in the second mask process, and a contact hole C21 that exposes the pixel electrodes 414 and 415, contact holes C22 and C23 that partially expose the active layer 511, and a contact hole C24 that exposes the upper electrodes 614 and 615 are formed.

While forming the contact hole C21, the first insulating layer 13 is etched along with the second insulating layer 15 during the patterning process of the second insulating layer 15 such that the second insulating layer 15 does not cover edges of the pixel electrodes 414 and 415 in order to increase the aperture ratio. As a result, the first insulating layer 13 and the second insulating layer 15 are formed to be spaced apart from the edges of the pixel electrodes 414 and 415. The etched surfaces of the first insulating layer 13 and the second insulating layer 15 are offset from the edges of the pixel electrodes 414 and 415, and thus, a gap G1 is formed therebetween.

When the contact hole C24 is formed, the second insulating layer 15 is patterned so as not to cover the edges of the upper electrodes 614 and 615 of the capacitor. Here, the first insulating layer 13 is also etched. A gap G2 is formed between the edges of the upper electrodes 614 and 615 and the etched surfaces of the first insulating layer 13 and the second insulating layer 15. If the second insulating layer 15 were to cover the edges of the upper electrodes 614 and 615, the lower electrode 611 could have a region corresponding to the region covered with the second insulating layer 15 in which the ion impurities are not doped, so that signal transmission quality of the capacitor could deteriorate.

Figure 4D:
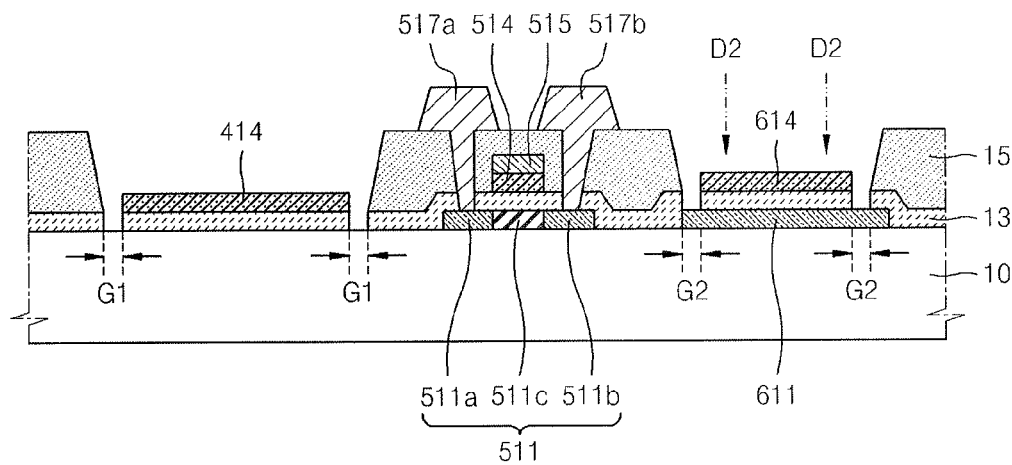

FIG. 4D shows a product obtained in a fourth mask process. Referring to FIG. 4D, the source electrode 517a and the drain electrode 517b are formed by stacking a metal layer on the product obtained in the third mask process and patterning the stack. In the pixel region and the capacitor region, the second layer 415 of the pixel electrode and the second layer 615 of the upper electrode are removed with the metal layer. Then, a secondary doping is performed.

By the secondary doping, ion impurities are doped in the semiconductor used to form the lower electrode 611. If the second insulating layer 15 were to cover the edges of the upper electrodes 614 and 615 during the third mask process, problems that generally occur on a region where ion impurities are not doped could occur in the lower electrode 611 corresponding to the covered region of the second insulating layer 15. However, a problem of not doping the lower electrode 611 does not occur.

However, the first insulating layer 13 is also etched when the second insulating layer 15 is etched. Thereby, the gap G2 is formed. A silicon-metal compound may be formed during the formation of the contact hole C24, by the reaction between the semiconductor material contained in the lower electrode 611 and metal contained in the source electrode 517a and the drain electrode 517b. If the silicon-metal compound is not removed and remains in the gap G2, current may leak between the upper electrode 614 and the lower electrode 611.

Figure 4E:
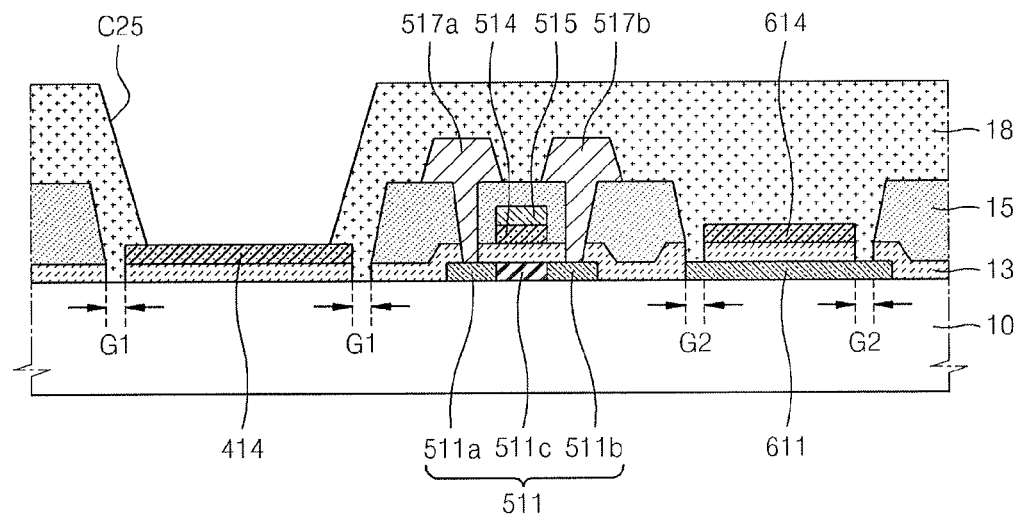

FIG. 4E shows a product obtained in a fifth mask process. Referring to FIG. 4E, a third insulating layer 18 is formed on the product of the fourth mask process, and a contact hole C25 that covers the edges of the first layer 414 of the pixel electrode and exposes the upper surface of the first layer 414 is formed.

As described above, although the organic light-emitting display device 2 is prepared by five mask processes, current leakage may occur in the capacitor. However, in the organic light-emitting display device 1 prepared according to an embodiment described above with reference to FIGS. 2A to 2E, current leakage may not occur in the capacitor.

Hereinafter, another embodiment will be described with reference to FIGS. 5 and 6A to 6E.

Figure 5:
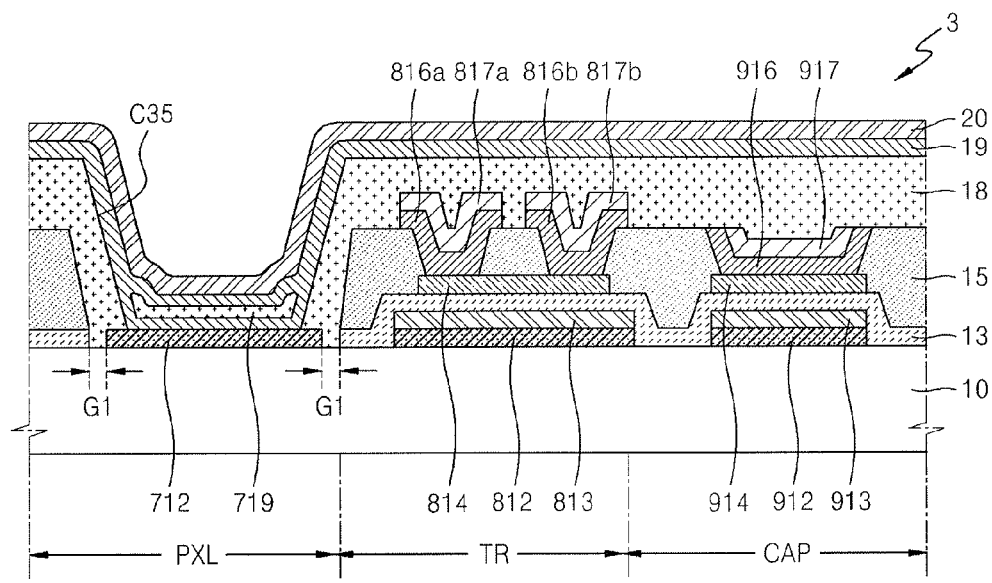
FIG. 5 is a schematic cross-sectional view of an organic light-emitting display device according to another embodiment.

FIG. 5 is a schematic cross-sectional view of an organic light-emitting display device 3 according to another embodiment. FIGS. 6A to 6E are cross-sectional views for describing stages of a method of preparing the organic light-emitting display device 3 of FIG. 5. Hereinafter, the current embodiment will be described in more detail based on differences from the previous embodiments.

Referring to FIG. 5, the organic light-emitting display device 3 according to the current embodiment includes a pixel region PXL, a transistor region TR, and a capacitor region CAP, which are formed on a substrate 10.

In the pixel region PXL, a pixel electrode 712 that includes a transparent conductive material is formed on the substrate 10. A first insulating layer 13 and a second insulating layer 15 are sequentially stacked on edges of the pixel electrode 712, and a gap G1 is formed between etched surfaces of the first and second insulating layers 13 and 14 and the edges of the pixel electrode 712. A third insulating layer 18 is formed on the second insulating layer 15, and an opening C35 that exposes the pixel electrode 712 is formed in the third insulating layer 18. An intermediate layer 19 including an organic emission layer 119 is formed on the pixel electrode 712. A counter electrode 20 is deposited on the intermediate layer 19 as a common electrode. Light emitted from the organic emission layer 119 proceeds toward the substrate 10 via the pixel electrode 712 formed of a transparent conductive material.

The transistor region TR may include at least one TFT. Gate electrodes 812 and 813 of the TFT are formed on the substrate 10. The gate electrodes 812 and 813 are formed on the same layer as the pixel electrode 712. The first insulating layer 13 is formed on the gate electrodes 812 and 813, and an active layer 814 of the TFT is formed on the first insulating layer 13. A portion of the second insulating layer 15 that functions as an interlayer insulating layer is formed on the active layer 814, and source electrodes 816a and 817a and drain electrodes 816b and 817b are formed on the second insulating layer 15.

As described above, the first layer 816a of the source electrode and the first layer 216b of the drain electrode may include amorphous silicon including ion impurities, and the second layer 817a of the source electrode and the second layer 817b of the drain electrode may include metal. In this regard, the first layer 816a of the source electrode and the first layer 816b of the drain electrode, which include amorphous silicon including ion impurities, directly contact the active layer 814 to reduce contact resistance of the TFT.

The active layer 814 is formed to be smaller than the gate electrodes 812 and 813 according to the current embodiment. The entire active layer 814 may be formed on the gate electrodes 812 and 813.

On the other hand, in the embodiment illustrated in FIG. 1, a portion of the active layer 214 is formed on the edges of the gate electrodes 212 and 213. As the size of a display device increases, the thickness of a wiring of a gate including a gate electrode may increase in order to reduce a resistance of the gate electrode. If the thickness of the gate electrode increases, a step coverage of the first insulating layer 13 may be reduced at edges of the gate electrodes 212 and 213, so that the possibility of short circuit may increase.

However, according to the current embodiment, the size of the gate electrodes 812 and 813 is increased to be larger than the active layer 814, i.e., the entire active layer 814 is formed on the gate electrodes 812 and 813, so that the possibility of a short circuit may be reduced.

The capacitor region CAP includes lower electrodes 912 and 913 and upper electrodes 914, 916, and 917 of the capacitor. The lower electrodes 912 and 913 may be formed on the same layer as the gate electrodes 812 and 813 using the same material. The portion of the first insulating layer 13 that functions as a dielectric layer is formed on the lower electrodes 912 and 913, and the upper electrodes 914, 916, and 917 are formed on the first insulating layer 13.

FIGS. 6A to 6E are cross-sectional views for describing mask processes used to prepare the organic light-emitting display device 3 of FIG. 5.

Figure 6A:
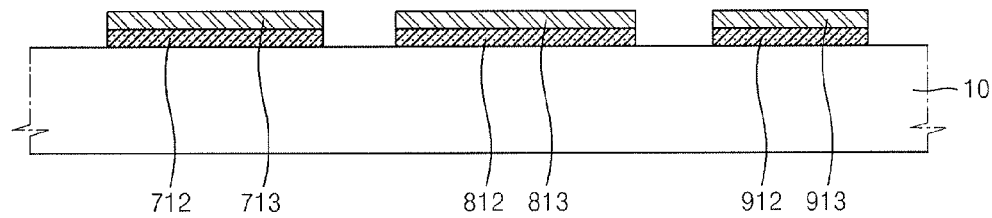
FIGS. 6A to 6E are cross-sectional views for describing mask processes used to prepare the organic light-emitting display device of FIG. 5.

FIG. 6A shows a product obtained in a first mask process. Referring to FIG. 6A, pixel electrodes 712 and 713, gate electrodes 812 and 813 of the TFT, and lower electrodes 912 and 913 of the capacitor are simultaneously patterned on the substrate 10.

Figure 6B:
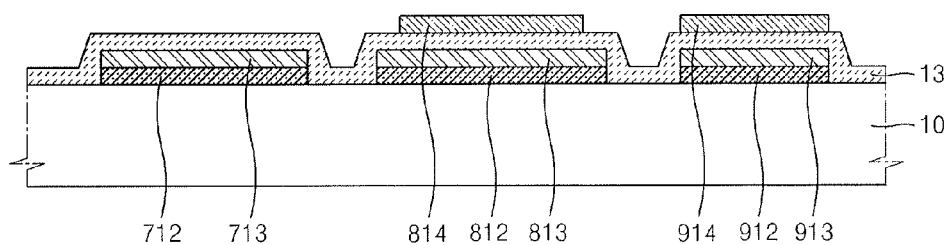

FIG. 6B shows a product obtained in a second mask process. Referring to FIG. 6B, the first insulating layer 13 is formed on the product of the first mask process, and the active layer 814 of the TFT and the first layer 914 of the upper electrode are formed on the first insulating layer 13. In this regard, the size of the active layer 814 is reduced to be less than the size of the gate electrodes 812 and 813, so that the entire active layer 814 is formed on the gate electrodes 812 and 813.

Figure 6C:
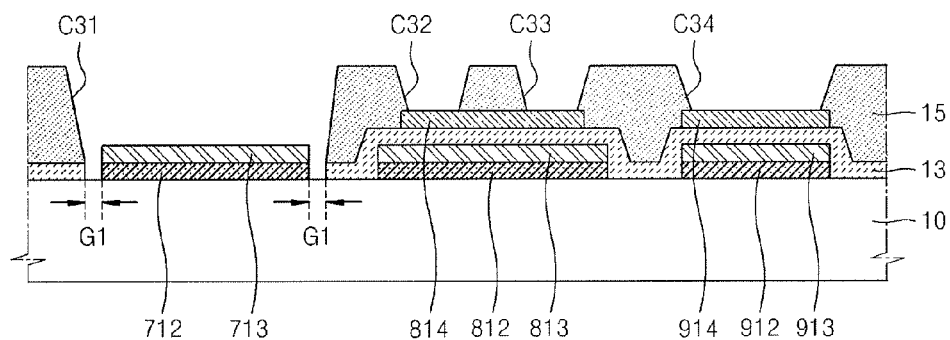

FIG. 6C shows a product obtained in a third mask process. Referring to FIG. 6C, the second insulating layer 15 is formed on the product of the second mask process, and a contact hole C31 that exposes the pixel electrodes 712 and 713, contact holes C32 and C33 that partially expose the active layer 214, and a contact hole C34 that exposes the first layer 913 of the upper electrode are formed.

Figure 6D:
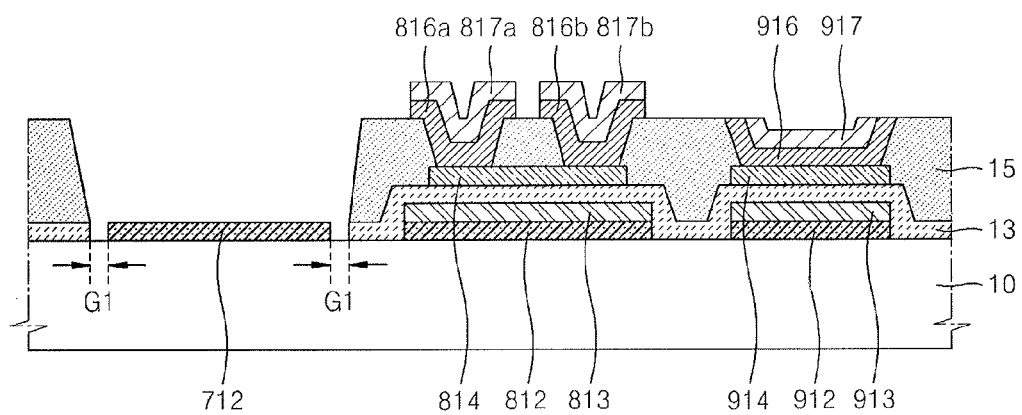

FIG. 6D shows a product obtained in a fourth mask process. Referring to FIG. 6D, source electrodes 816a and 817a, drain electrodes 816b and 817b, of which layers 816a and 816b partially contact the active layer 814, and second layers 916 and 917 of the upper electrode, of which the second layer 916 contacts the first layer of the upper electrode are formed on the product of the third mask process. The second layer 713 of the pixel electrode is also etched to expose the first layer 712 of the pixel electrode.

Figure 6E:
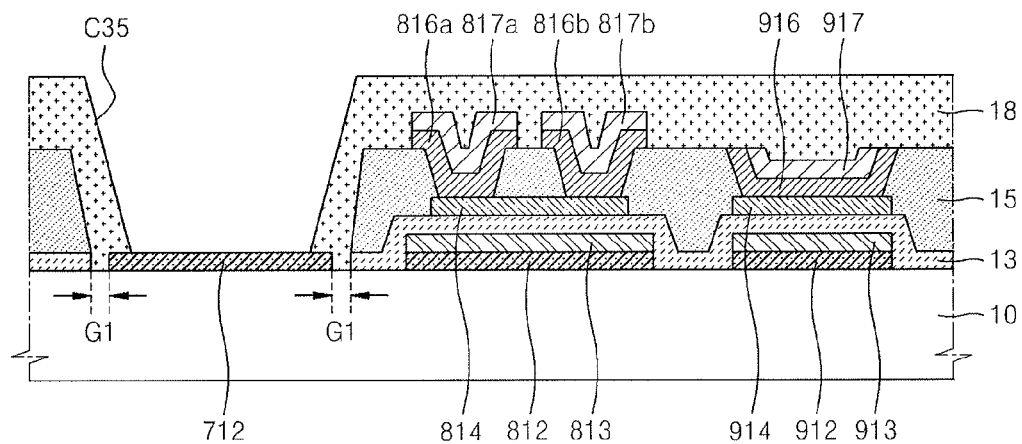

FIG. 6E shows a product obtained in a fifth mask process. Referring to FIG. 6E, a third insulating layer 18 is formed on the product obtained in the fourth mask process, and a contact hole C35 that covers the edges of the first layer 712 of the pixel electrode and exposes the upper surface of the first layer 712 is formed.

By way of summation and review, in a pattern transferring process, a mask including a desired pattern should be prepared. In a method of manufacturing a thin-film array substrate of an organic light-emitting display device, as the number of stages that each require a different mask increases, the manufacturing costs for preparing the masks also increases. Also, the process of preparing the masks may become complicated due to the high number of stages, and thus, the overall process for manufacturing the substrate may be time consuming and expensive.

According to the one or more of embodiments, an organic light-emitting display device including a bottom gate type TFT may be prepared by using only five mask processes in total.

In addition, a contact resistance may be reduced by forming an amorphous silicon layer doped with ion impurities between the active layer and the source and drain electrodes. An electrical capacity may be increased by using a MIN CAP as the capacitor. The dielectric layer may be protected by using a portion of the upper electrode of the capacitor doped with ion impurities as an etch stop layer for the insulating layer.

As described above, according to the one or more of the above embodiments, a thin-film transistor array substrate, an organic light-emitting display device, and a method of manufacturing the thin-film transistor array substrate may have the following effects. An organic light-emitting display device including a bottom gate type thin film transistor (TFT) may be manufactured by using five mask processes in total. A contact resistance of the TFT may be reduced by forming an amorphous silicon layer doped with ion impurities between an active layer and source and drain electrodes. An electrical capacity may be increased by using a MIN CAP as the capacitor. The dielectric layer may be protected by using a portion of the upper electrode of the capacitor doped with ionic impurities as an etch stop layer for the insulating layer.

While embodiments have been particularly shown and described with reference to exemplary embodiments thereof, it will be understood by those of ordinary skill in the art that various changes in form and details may be made therein without departing from the spirit and scope thereof, as defined by the following claims.

What is claimed is:

1. A thin film transistor array substrate, comprising:
   a thin film transistor including a gate electrode, an active layer, and source and drain electrodes;
   a pixel electrode on a same layer as the gate electrode;
   a lower electrode of a capacitor, the lower electrode being on the same layer as the gate electrode;
   a first insulating layer on the gate electrode and the lower electrode;
   a second insulating layer between the active layer and the source and drain electrodes;
   an upper electrode on the first insulating layer, the upper electrode including a first layer made of a same material as the active layer, and a second layer made of a same material as the source and drain electrodes; and
   a third insulating layer that covers the source and drain electrodes and the upper electrode and exposes the pixel electrode.

2. The thin film transistor array substrate of claim 1, wherein the gate electrode and the lower electrode each include a first layer including a transparent conductive material and a second layer including a metal.

3. The thin film transistor array substrate of claim 1, wherein the active layer and the first layer of the upper electrode include crystalline silicon.

4. The thin film transistor array substrate of claim 1, wherein the source and drain electrodes and the second layer of the upper electrode include a first portion including ion impurity-containing amorphous silicon and a second portion including metal, the second portion being on the first portion.

5. The thin film transistor array substrate of claim 4, wherein the first portion of the source and drain electrodes partially contacts first and second portions of the active layer via first and second contact holes formed in the second insulating layer.

6. The thin film transistor array substrate of claim 1, wherein the first portion of the second layer of the upper electrode directly contacts the first layer of the upper electrode via a third contact hole formed in the second insulating layer.

7. The thin film transistor array substrate of claim 1, wherein the first insulating layer and the second insulating layer are offset from edges of the pixel electrode.

8. The thin film transistor array substrate of claim 1, wherein the third insulating layer covers edges of the pixel electrode.

9. The thin film transistor array substrate of claim 1, wherein a border of the active layer is greater than the gate electrode such that the active layer covers a border of the gate electrode.

10. The thin film transistor array substrate of claim 1, wherein a border of the active layer is offset from a border of the gate electrode.

11. An organic light-emitting display device, comprising:
a thin film transistor that includes a gate electrode, an active layer, and source and drain electrodes;
a pixel electrode on a same layer as the gate electrode;
a lower electrode of a capacitor, the lower electrode being on the same layer as the gate electrode;
a first insulating layer on the gate electrode and the lower electrode;
a second insulating layer between the active layer and the source and drain electrodes;
an upper electrode on the first insulating layer, the upper electrode including a first layer made of a same material as the active layer, and a second layer made of a same material as the source and drain electrodes;
a third insulating layer that covers the source and drain electrodes and the upper electrode and exposes the pixel electrode;
an intermediate layer on the pixel electrode, the intermediate layer including an organic emission layer; and
a counter electrode on the intermediate layer.

12. The organic light-emitting display device of claim 11, wherein the counter electrode is a reflective electrode that reflects light emitted from the organic emission layer.

13. The organic light-emitting display device of claim 11, wherein:
the pixel electrode includes a transparent conductive material, and
the gate electrode and the lower electrode include a first layer including a transparent conductive material and a second layer including metal.

14. The organic light-emitting display device of claim 11, wherein the active layer and the first layer of the upper electrode include crystalline silicon.

15. The organic light-emitting display device of claim 11, wherein:
the upper electrode of the capacitor includes a first layer made of a same material as the active layer, and a second layer made of a same material as the source and drain electrodes, and
the source and drain electrodes and the second layer of the upper electrode include a first portion including ion impurity-containing amorphous silicon and a second portion including metal, the second portion being on the first portion.

16. A method of manufacturing a thin-film transistor array substrate, the method comprising:
a first mask process, wherein a transparent conductive layer and a first metal layer are sequentially formed on a substrate, and a pixel electrode, a gate electrode of a thin film transistor, and a lower electrode of a capacitor are formed by patterning the transparent conductive layer and the first metal layer;
a second mask process, wherein an active layer of the thin film transistor and a first layer of an upper electrode of the capacitor are formed by sequentially stacking a first insulating layer and a first semiconductor layer and patterning the first semiconductor layer;
a third process, wherein a second insulating layer and contact holes that expose the pixel electrode, a portion of the active layer, and the first layer of the upper electrode are formed;
a fourth mask process, wherein source and drain electrodes that partially contact the active layer, and the second layer of the upper electrode are formed by sequentially stacking a second semiconductor layer and a second metal layer and patterning the second semiconductor layer and the second metal layer; and
a fifth mask process, wherein a third insulating layer is formed, and a portion of the third insulating layer formed on the pixel electrode is removed,
wherein the thin-film array substrate formed thereby includes the thin film transistor including the gate electrode, the active layer, and the source and drain electrodes, the pixel electrode on a same layer as the gate electrode, the lower electrode of a capacitor, the lower electrode being on the same layer as the gate electrode, the first insulating layer on the gate electrode and the lower electrode, the second insulating layer between the active layer and the source and drain electrodes, the upper electrode on the first insulating layer, the upper electrode including the first layer made of a same material as the active layer, and the second layer made of a same material as the source and drain electrodes, and the third insulating layer that covers the source and drain electrodes and the upper electrode and exposes the pixel electrode.

17. The method of claim 16, wherein the first semiconductor layer that is stacked and patterned in the second mask process includes crystalline silicon.

18. The method of claim 16, wherein a border of the active layer formed in the second mask process is greater than the gate electrode such that the active layer covers a border of the gate electrode.

19. The method of claim 16, wherein the border of the active layer formed in the second mask process is offset from a border of the gate electrode.

20. The method of claim 16, wherein, in the third mask process, a gap is formed between etched surfaces of the first and second insulating layers and the pixel electrode.

21. The method of claim 16, wherein, in the fourth mask process, the first metal layer, the second semiconductor layer, and the second metal layer are simultaneously etched in the pixel electrode.

22. The method of claim 16, wherein the second semiconductor layer formed in the fourth mask process includes amorphous silicon including ion impurities.

* * * * *